(12) United States Patent
Koike et al.

(10) Patent No.: US 7,592,604 B2
(45) Date of Patent: Sep. 22, 2009

(54) CHARGED PARTICLE BEAM APPARATUS

(75) Inventors: Hirotami Koike, Tokyo (JP); Shinichi Okada, Tokyo (JP); Akira Higuchi, Tokyo (JP); Masahiro Inoue, Tokyo (JP); Masahiro Yamamoto, Tokyo (JP); Sumio Sasaki, Tokyo (JP)

(73) Assignee: Topcon Corporation, Tokyo (JP)

( * ) Notice: Subject to any disclaimer, the term of this patent is extended or adjusted under 35 U.S.C. 154(b) by 456 days.

(21) Appl. No.: 11/637,946

(22) Filed: Dec. 13, 2006

(65) Prior Publication Data

US 2007/0246651 A1 Oct. 25, 2007

(30) Foreign Application Priority Data

Dec. 16, 2005 (JP) ............................. 2005-362703

(51) Int. Cl.
*G01K 1/08* (2006.01)
*H01J 3/14* (2006.01)
*H01J 3/16* (2006.01)

(52) U.S. Cl. ................... 250/398; 250/306; 250/307; 250/310; 250/311; 250/396 R; 250/491.1; 250/492.1; 250/492.21; 250/492.22; 250/492.23; 250/423 R; 250/423 F

(58) Field of Classification Search .............. 350/306, 350/307, 310, 311, 398, 396 R, 491.1, 492.1, 350/492.21, 492.22, 492.23, 423 R, 423 F
See application file for complete search history.

(56) References Cited

U.S. PATENT DOCUMENTS 6,303,932 B1 * 10/2001 Hamamura et al. ........... 850/43
6,900,443 B2 * 5/2005 Schlichting ................. 250/398

* cited by examiner

*Primary Examiner*—Jack I Berman
*Assistant Examiner*—Meenakshi S Sahu
(74) *Attorney, Agent, or Firm*—Kubovcik & Kubovcik

(57) ABSTRACT

The present invention provides a charged particle beam apparatus capable of preventing the charging-up of the specimen without using a large-scale facility. A scanning electron microscope 100 illuminates a specimen 21 with a charged particle beam via a charged particle optical system arranged in a column. According to the present invention, the scanning electron microscope 100 has a charge preventive member 110 disposed between the objective lens 14 and the specimen 21. The charge preventive member 110 has an electrically conductive portion and an opening 113 to transmit the charged particle beam. The charge preventive member 110 is formed so as to partly cover the charged particle optical system when viewed from the charged particle beam irradiation spot on the specimen. In addition, the charge preventive member 110 has gas inflow paths 114 and 115 formed therein. These gas inflow paths have gas injection outlets 116 formed to inject gas toward the charged particle beam irradiation spot on the specimen.

17 Claims, 9 Drawing Sheets

CHARGED PARTICLE BEAM APPARATUS

BACKGROUND OF THE INVENTION

1. Field of the Invention

The present invention relates to charged particle beam apparatus, such as scanning electron microscopes, electron beam exposure apparatus, ion implantation apparatus and other semiconductor manufacturing apparatus which irradiate wafers and other specimens with electron beams, ion beams and other charged particle beams.

2. Description of the Related Art

In charged particle beam apparatus, such as scanning electron microscopes, various methods have so far been used to prevent a specimen from being charged by electron beam irradiation. One of them is to cover the specimen with a metal or other conductive thin film.

In addition, for such scanning electron microscopes as CD-SEM, it is proposed to set up a nozzle near the specimen within the chamber as disclosed in Japanese Patent Laid-Open No. 2005-235777 and Japanese Patent Laid-Open No. 2004-327302. In this technique, $N_2$, Ar, $O_3$ or other gas is supplied onto the specimen in order to avoid the charging up of the specimen.

However, in the case of semiconductor manufacture, if a wafer under examination is coated with metal or the like, this wafer can not directly be put into the subsequent process. Likewise, if a mask under examination is coated with a conductive thin film, a process of removing this thin film is necessary. If the removal process is imperfect, the thin film would leave residuals as defects.

In addition, a typical recent high resolution electron optical system has a retarding electric field between the specimen and the objective lens as disclosed in Japanese Patent No. 30149986 and Japanese Patent Laid-Open No. 2003-187733. In such an electron optical system, a gas emission nozzle can not be disposed near the specimen below the objective lens since discharge would occur.

To raise the resolution of an electron optical system, it is also necessary to shorten the work distance. Therefore, it is sometimes impossible to dispose a nozzle between the specimen and the bottom of the electron optical system as disclosed in Non-Patent Document 1.

Further, as disclosed in a figure of "Charging Reduction in a Review SEM by Local Gas Injection" (LSI Testing symposium 2005 proceeding, 2005. 11. 9-11) (see FIG. 9), gas injection poses a problem that the resolution of the charged particle optical system deteriorates according as the degree of vacuum deteriorates apart from the disadvantage that the apparatus becomes larger in scale due to the gas introduction system and vacuum control.

SUMMARY OF THE INVENTION

In conventional charged particle beam apparatus described above, various means are employed in order to prevent the charging-up of the specimen. In the process of semiconductor manufacture, however, metal coating can not be made to wafers. In addition, introducing gas into the chamber requires a large-scale apparatus and facility.

Therefore, it is an object of the present to solve the aforementioned problem and provide a charged particle beam apparatus which is applicable to the process of semiconductor manufacture and can prevent the charging-up of the specimen without using a large-scale facility.

To solve the above-mentioned problem, the present invention sets a CPP (Charge Preventive Plate) in the charged particle optical system of a charged particle beam apparatus. Charging-up of the specimen can be prevented since the CPP can inject gas accurately to the vicinity of the specimen and remove the gas by differential piping. The present invention provides a charged particle beam apparatus which illuminates a specimen with a charged particle beam focused thereon via a charged particle optical system arranged in a column, characterized in that: between the charged particle optical system and the specimen, there is provided a plate-like member having an electrically conductive portion and an opening to transmit the charged particle beam; and for the plate-like member to function as a charge preventive plate, the plate-like member is configured in such a manner that the plate-like member is enough large to cover at least a part of the charged particle optical system when viewed from the charged particle beam irradiation spot on the specimen, the plate-like member has a gas inflow path formed therein, and the gas inflow path has gas injection outlets formed to inject gas toward the charged particle beam irradiation spot on the specimen.

In the above-mentioned charged particle beam apparatus, the conductance between the plate-like member and the specimen may be made larger than the conductance between the plate-like member and the charged particle optical system. The side of the plate-like member which faces the specimen may have one or more gas injection outlets. Voltages may be applied respectively to the specimen or a holding member to hold the specimen and to the electrically conductive portion of the specimen. The voltage applied to the electrically conductive portion of the specimen may be a negative voltage which is substantially equal to or smaller than the voltage applied to the specimen or the specimen holding member.

Further, the plate-like member may be fixed insulatively to a lower magnetic pole of an objective lens disposed in the lower portion of the column. The opening of the plate-like member may be several millimeters in diameter. The plate-like member may be configured as a part of a lower magnetic pole of an objective lens disposed in the lower portion of the column.

Further, for the plate-like member to function as a charge preventive plate, the charged particle beam apparatus may be configured in such a manner that the charged particle optical system has an inner cylinder to transmit the charged particle beam, a positive voltage is applied to the inner cylinder and the specimen and the plate-like member are earthed.

The present invention also provides a charged particle beam apparatus which illuminates a specimen with a charged particle beam focused thereon via a charged particle optical system, characterized in that: a non-magnetic member is set to an objective lens of the charged particle optical system, the sides of the non-magnetic member which respectively faces the light path of the charged particle optical system and the specimen are electrically conductive, the non-magnetic member has a gas inflow path formed therein, and the gas inflow path has gas injection outlets formed on the side of the non-magnetic member facing the specimen to inject gas toward the charged particle beam irradiation spot on the specimen. The conductance between the bottom of the non-magnetic member and the specimen may be larger than the conductance of the non-magnetic member along the light path of the charged particle optical system.

Also in the above-mentioned charged particle beam apparatus, the non-magnetic member may be constituted by a specimen-side component facing the specimen and a light path-side component facing the light path of the charged particle optical system wherein the specimen-side component and the light path-side component are electrically insulated from each other and voltages may be applied respectively to the specimen or a specimen holding member and to the specimen-side component of the non-magnetic member. The voltage applied to the specimen-side component of the non-magnetic member may be a negative voltage which is substantially equal to or smaller than the voltage applied to the specimen or the specimen holding member.

The gas used in charged particle beam apparatus according to the present invention may comprise at least one kind of gas selected from nitrogen, argon, oxygen and ozone.

For the non-magnetic member to function as a charge preventive member, the charged particle beam apparatus may be configured in such a manner that the charged particle optical system has an inner cylinder to transmit the charged particle beam, a positive voltage is applied to the inner cylinder and the specimen and the non-magnetic member are earthed.

That is, in a charged particle beam apparatus according to the present invention, gas is emitted from the injection outlets of the charge preventive member toward the charged particle beam irradiation spot on the specimen. The emitted gas is ionized as a result of reacting with primary electrons of the electron beam or secondary electrons or reflected electrons caused by the electron beam. Since created ions react with electrons on the surface of the specimen, it is possible to prevent charging-up of the specimen by removing negative charges from the specimen. Further, since the gas is efficiently supplied to the charged particle beam irradiation spot on the specimen, it is possible to reduce the gas injection rate and consequently eliminate the necessity of using a large-scale gas feed system. In addition, since the charge preventive member is biased at a voltage which is almost equal to or smaller than the voltage (negative voltage) of the specimen so as to reduce the potential difference between the charge preventive member and the specimen, it is possible to avoid the charging and discharging of the specimen.

Further, since the conductance between the bottom of the charge preventive member and the specimen is made larger than the conductance of the charge preventive member along the light path of the charged particle optical system, ions which are generated in the specimen chamber from the injected gas as a result of ionization by primary electrons incident on the specimen and secondary and reflected ions from the specimen are not likely to penetrate into the column via the opening of the charge preventive member.

This serves to allow the specimen chamber to be evacuated by differential pumping independent of the column having the charged particle optical system arranged therein.

BRIEF DESCRIPTION OF THE DRAWINGS

FIGS. 3A and 3B each show a charge preventive member included in FIG. 2 wherein FIG. 3A is its longitudinal section view and FIG. 3B is its top view;

DETAILED DESCRIPTION OF THE PREFERRED EMBODIMENTS

The following will describe charged particle beam apparatus, embodiments of the present invention. Note that the present invention is not limited to the embodiments described below. Various changes may be made thereto without departing from the scope of the appended claims.

Figure 1:
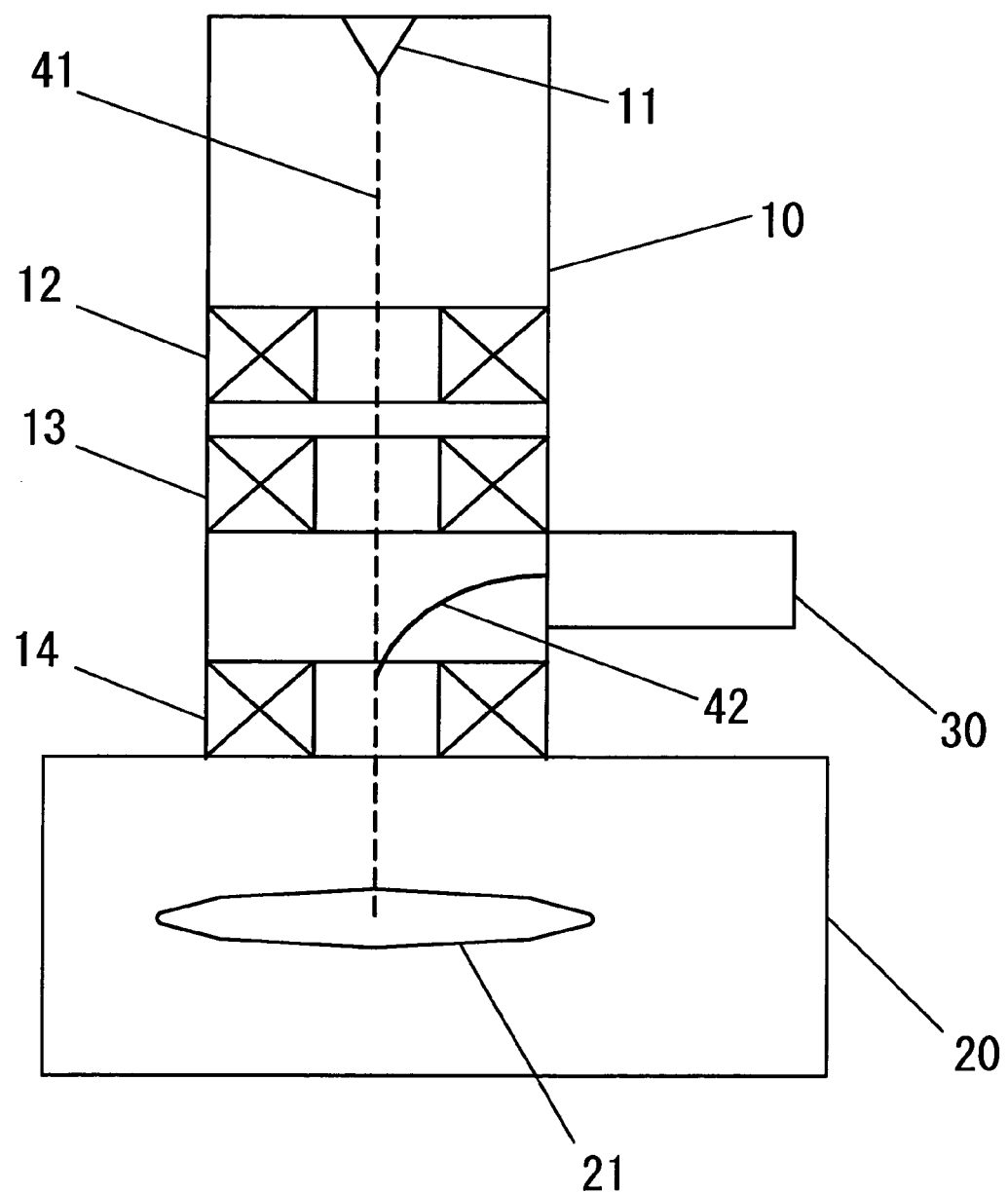
FIG. 1 is a sectional drawing showing the configuration of a charged particle beam apparatus embodiment.
Figure 2:
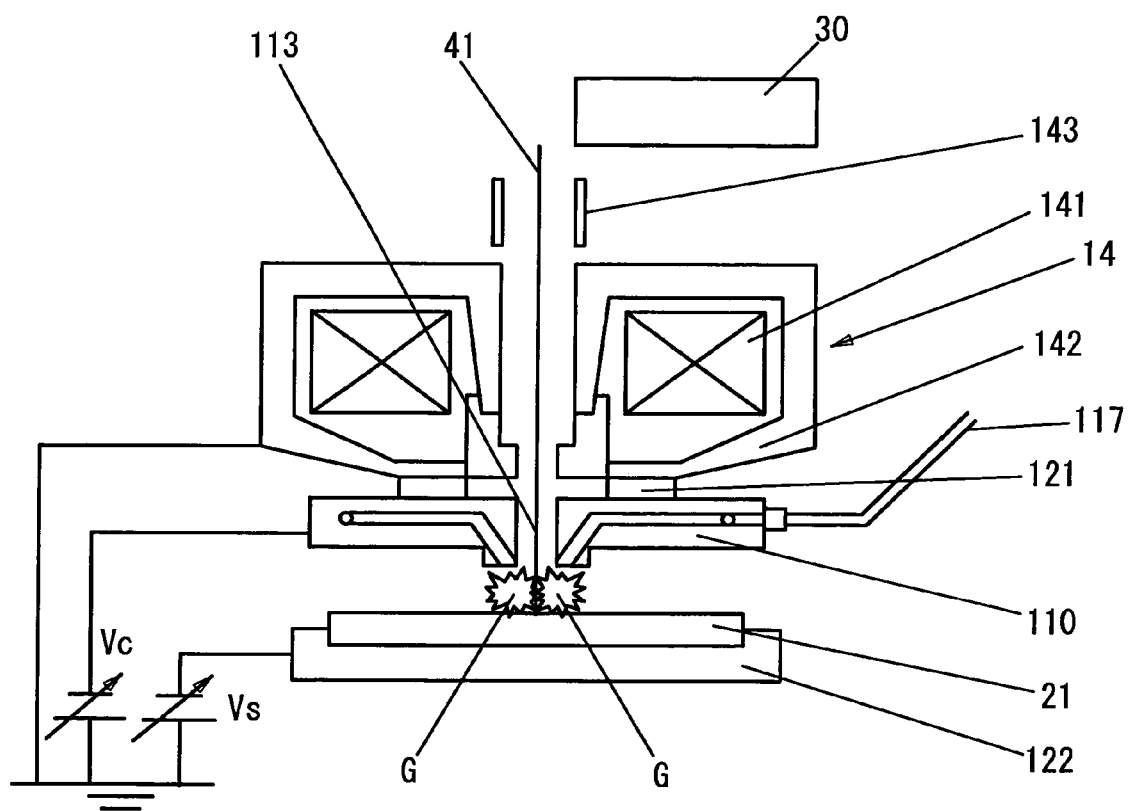
FIG. 2 shows a transversesection of the charged particle optical system's lower portion of the charged particle beam apparatus shown in FIG. 1.
Figure 3A:
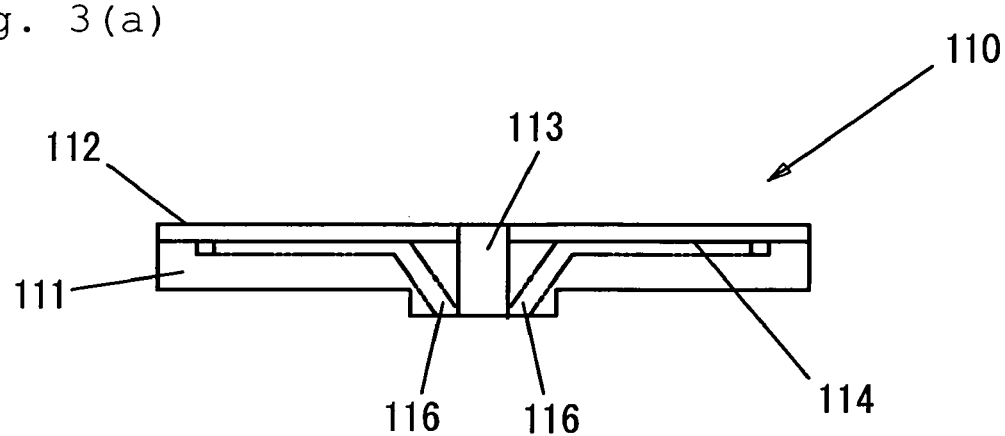
Figure 3B:
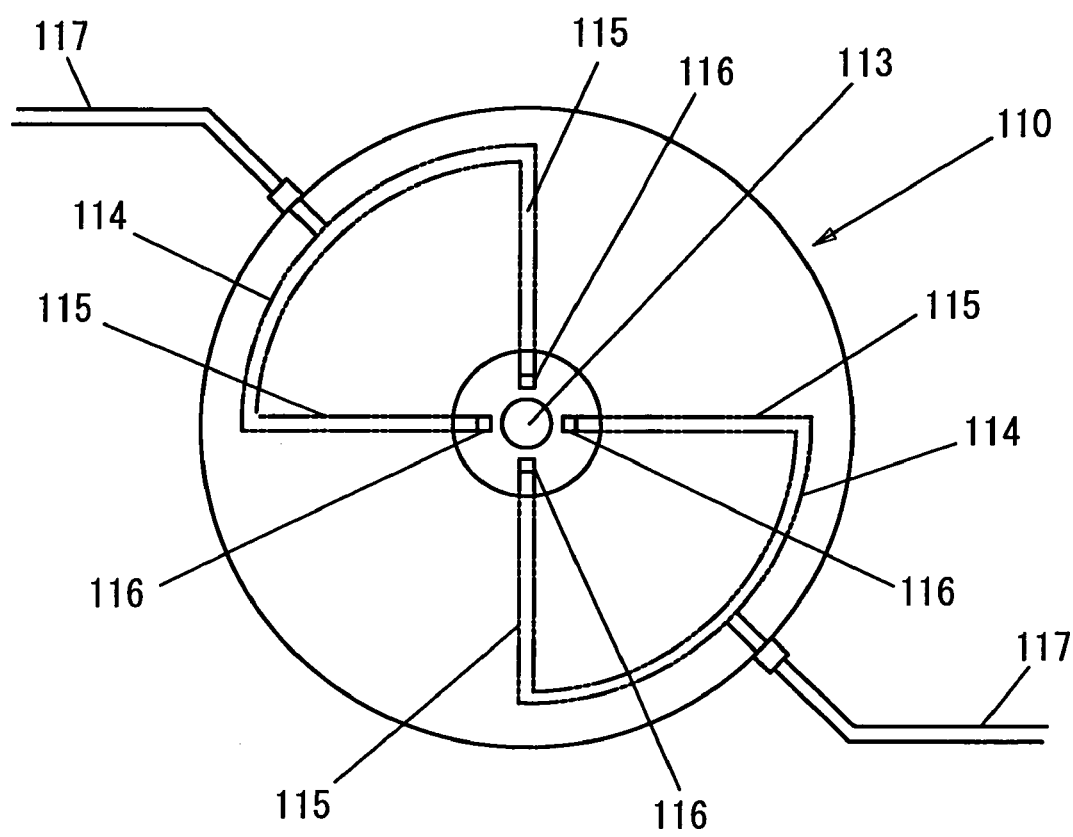

FIG. 1 is a sectional drawing showing the configuration of a charged particle beam apparatus in accordance with a first embodiment. FIG. 2 shows a transversesection of the charged particle optical system's lower portion of the charged particle beam apparatus shown in FIG. 1. FIGS. 3A and 3B shows a charge preventive member included in FIG. 2 wherein FIG. 3A is its longitudinal section view and FIG. 3B is its top view.

The present charged particle beam apparatus embodiment is a scanning electron microscope 100 having a charged particle optical system disposed in a column 10. This scanning electron microscope 100 has an electron beam source 11 disposed in the upper part of the column 10. An electron beam 41 generated from this electron beam source 11 is deflected by an alignment coil 12 (first deflection means) and a stig coil 13 (second deflection means) to scan a specimen 21 after the magnification is adjusted by an objective lens 14 (magnification adjustment means). Consequently, charged particles 42 from the specimen 21, including secondary electrons and reflected electrons, are detected by a detector 30 to display a specimen image on a monitor or other image display means not shown in the figure.

In the present embodiment, the charged particle optical system of the scanning electron microscope 100 has a charge preventive plate-like member 110 which also serves to introduce gas. Called a CPP (Charge Preventive Plate), this charge preventive member 110 emits gas toward an area of the specimen irradiated with charged particles. A negative voltage is applied to the charge preventive member 110. Alternatively, the charge preventive member 110 may be earthed together with the specimen 21 as described later. In this case, a positive voltage may be applied to the whole column 10 in which the charged particle optical system is arranged.

In the present embodiment, the objective lens 14 is disposed in the lower portion of the charged particle optical system. The objective lens 14 comprises a coil 141, magnetic pole 142 and deflector 143. Before the electron beam 41 emitted from the electron beam source 11 illuminates the specimen 21, the electron beam 41 is deflected by the deflector 143 and focused by the magnetic pole 142 which is magnetized by the coil 141. The deflector 143 is, for example, an eight-pole electrostatic deflector. The specimen 21 is held by a specimen holder 122.

In the present embodiment, the charge preventive member 110 is disposed between the objective lens 14 and the specimen 21. The charge preventive member 110 is attached to the magnetic pole 142 via a securing part 121 made of insulating material. In the present embodiment, the charge preventive member 110 is several mm in thickness. Without touching the objective lens 14 and the specimen 21, the charge preventive member 110 is disposed between the objective lens 14 and the specimen 21.

In the present embodiment, the charge preventive member 110 is biased with voltage Vc while the specimen 12 is biased with voltage Vs via the specimen holder 122. These voltages Vc and Vs are respectively negative. The objective lens 14 is earthed.

The present embodiment may be modified in such a manner that the charge preventive member 110 is constructed as a lower magnetic pole member of the objective lens 14 disposed in the lower portion of the column. In this case, the objective lens 14 must comprise an upper magnetic pole and a lower magnetic pole which are electrically insulated from each other. It is possible to electrically insolate the upper magnetic pole from the lower magnetic pole by inserting a spacer (insulating member) between the upper magnetic pole and the lower magnetic pole. To obtain the same effect as the present embodiment, gas inlet channels are formed in the lower magnetic pole by boring them in conformity with the geometry of the lower magnetic pole.

As shown in FIG. 3, the charge preventive member 110 is assembled by joining two plate-like members 111 and 112 together. To transmit the electron beam, the charge preventive member 110 has an opening 113 formed at the center thereof. In addition, circumferential flow channels 114 and four radial flow channels 115 are formed between the plate-like members 111 and 112. These flow channels 114 and 115 have four injection outlets 116 around the opening 113. Further, in the present embodiment, the flow channels 115 near their injection outlets 116 are inclined toward the electron beam irradiation spot on the specimen 21. The flow channels 114 are connected with gas inlet tubes 117. Nitrogen ($N_2$), argon (Ar) or other inert gas is supplied from a gas feed unit not shown in the figure. It is also possible to use oxygen ($O_2$), ozone ($O_3$) or the like. In the present embodiment, nitrogen ($N_2$) is used.

In the present embodiment, since the flow channels 115 near their injection outlets 116 are inclined toward the electron beam irradiation spot on the specimen 21, nitrogen gas goes toward the electron beam irradiation spot on the specimen if the nitrogen gas is emitted from 114 under a predetermined condition. In the present embodiment, this emitted gas G is ionized as a result of reacting with primary electrons of the electron beam or secondary electrons or reflected electrons caused by the electron beam. Created ions react with electrons on the surface of the specimen 21. This removes negative charges from the specimen 21, avoiding the charging-up of the specimen 21. Since gas G is emitted toward the charged particle beam irradiation spot, gas G is efficiently supplied to the vicinity of the charged particle beam irradiation spot on the specimen. This makes it possible to reduce the gas injection rate.

Note that each of the gas injection outlets may be provided with a nozzle whose angle of inclination can automatically be changed. In addition, although the present embodiment has four injection outlets located around the opening 113 of the charge preventive member 110, the injection outlets may be changed in population and formation. For example, gas injection slits may be formed around the opening 113. In addition, the number of gas injection outlets may be increased to 6, 8, . . . .

Figure 6:
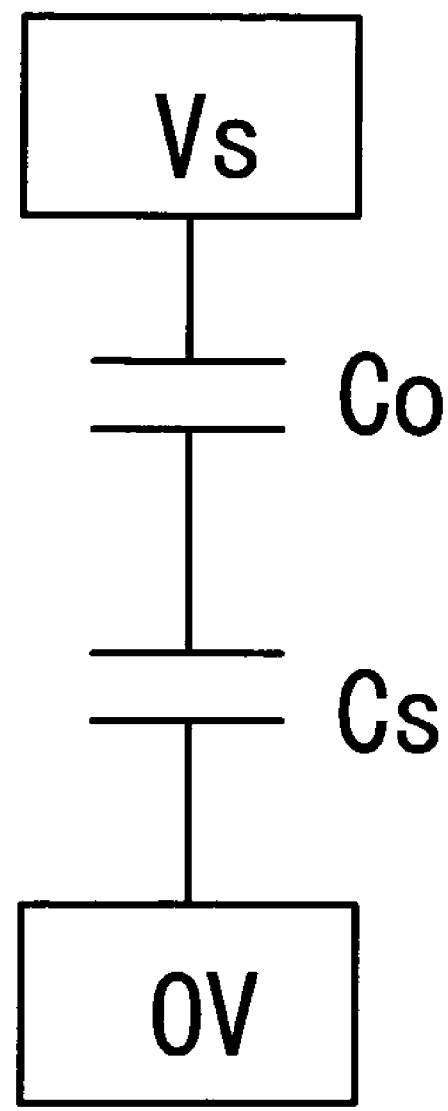
FIG. 6 is the diagram of an equivalent electrical circuit constituted by the charged particle optical system's lower portion, the charge preventive member and the specimen.

The following provides a description of how to reduce the electric charge of the specimen. If the specimen is a mask made of insulating material (such as quartz), the equivalent circuit can be drawn as shown in FIG. 6 wherein the potential of the earth (ground) is assumed to be 0V. In this equivalent circuit, the following expression is met:

$$Vg=VsCo/(Cs+Co) \quad (1)$$

where,
Co: Electric capacitance between the mask surface and the column bottom
Cs: Electric capacitance of the mask
Vg: Potential of the specimen surface Equation (1) indicates that the potential Vg of the specimen surface can be reduced by making smaller the capacitance Co between the mask surface and the column bottom.

Namely, the potential Vg of the specimen surface is minimized if the following expression is met:

$$Cs>>Co \quad (2)$$

where, $Co=\epsilon_0 S/d$ and
$\epsilon_0$: Vacuum dielectric constant
S: Area of the opening
d: Distance between the mask and the column bottom.

Another method is to reduce the electric field between the mask surface and the CPP. Under a uniform electric field E, the following surface polarization charge density $\sigma g$ appears on the mask (dielectric plate):

$$\sigma g=\epsilon_0((\epsilon^*-1)E/\epsilon_0) \quad (3)$$

* in this equation denotes its complex conjugate.

The smaller the electric field E becomes, the polarization charge decreases. Applying almost the same voltage to both the specimen holder and the CPP substantially reduces the electric field E. Making smaller the opening of the CPP also reduces the electric field E since the leakage electric field is reduced.

Figure 4:
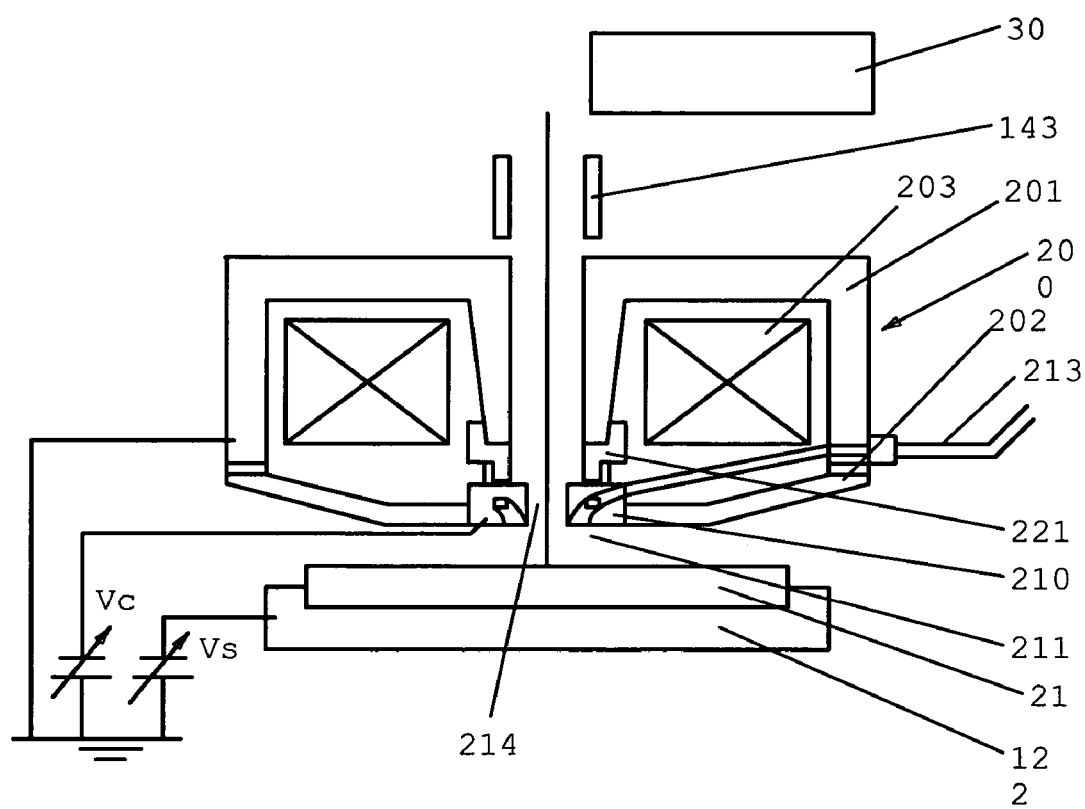
FIG. 4 is a sectional drawing showing the configuration of a charged particle beam apparatus in accordance with another embodiment.
Figure 5:
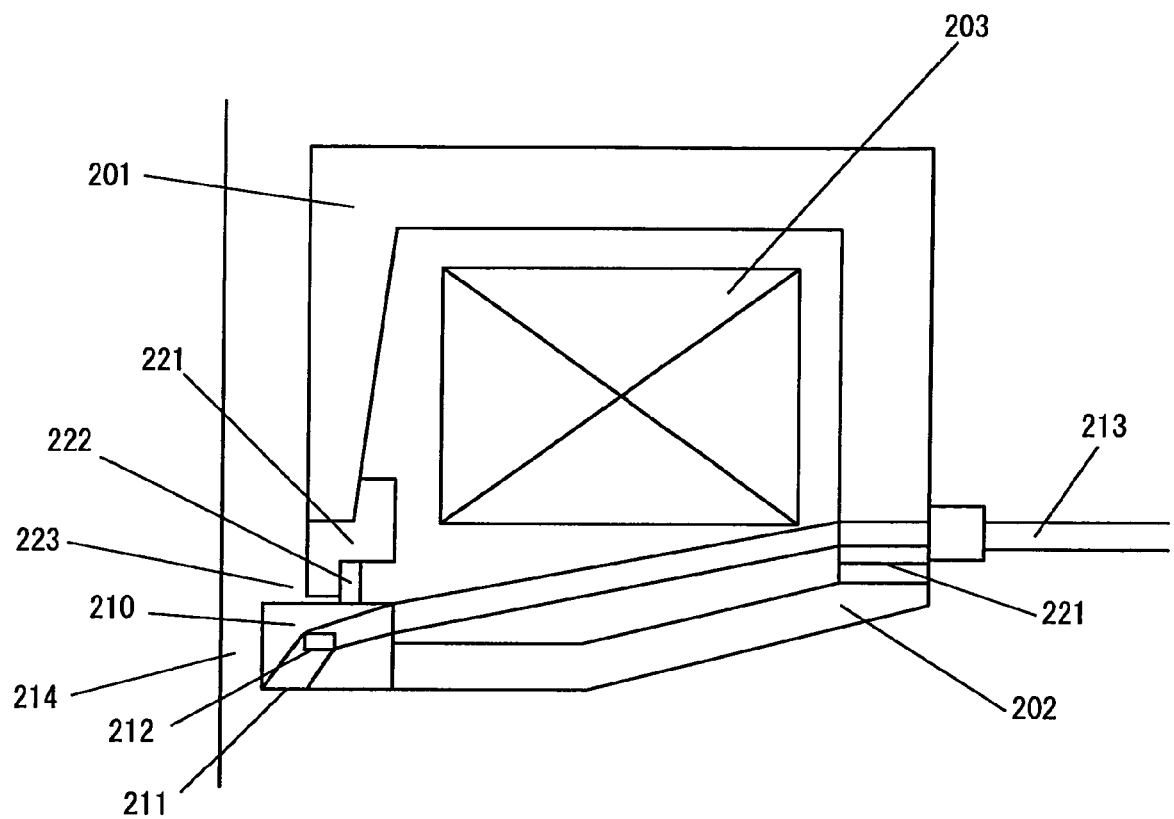
FIG. 5 is an enlarged view of the lower portion of the charged particle optical system shown in FIG. 4.

The following describes another charged particle beam apparatus, a second embodiment of the present invention. FIG. 4 is a sectional drawing showing the configuration of the charged particle beam apparatus in accordance with the second embodiment. FIG. 5 is an enlarged view of the charged particle optical system's lower portion of the second embodiment.

In the charged particle optical system of the present charged particle beam apparatus embodiment, a non-magnetic charge preventive member 210 is engaged with the lower magnetic pole 202 of the objective lens 200. In the present embodiment, the objective lens 200 comprises an upper magnetic pole 201, a lower magnetic pole 202 and an internal coil 203 disposed between them.

In the present embodiment, the charge preventive member 210 is made of non-magnetic material and has an opening 214 formed at the center thereof. In addition, the charge preventive member 210 has gas flow channels 212 formed to introduce gas. These gas flow channels 212 have four gas injection outlets formed axisymmetrically around the opening 214 in order to inject gas toward the electron beam irradiation spot on the specimen 21. The gas flow channels 212 are connected with gas inlet tubes 213. Nitrogen ($N_2$), argon (Ar) or other inert gas is supplied from a gas feed unit not shown in the figure. It is also possible to use oxygen ($O_2$), ozone ($O_3$) or the like.

Similar to the aforementioned first embodiment, the charge preventive member 210 is biased with voltage Vc and the specimen 21 is biases with voltage Vs via the specimen holder 122. Voltages Vc and Vs are both negative. The objective lens 200 is earthed.

In the present embodiment, as shown in FIG. 5, the charge preventive member 210 is fixed to the upper magnetic pole 201 via a non-magnetic member 221 and an insulator 222 inside the non-magnetic member 221 so that a several mm gap 223 is secured between the non-magnetic member 221 and the charge preventive member 210 so as not to allow electrical connection between them. The side (where the injection outlets 211 are formed) of the charge preventive member 210 which faces the specimen 21 is kept electrically conductive. As well, the side along the optical axis of the charged particle beam is kept electrically conductive. The side of the non-magnetic member 221 along the optical axis of the charged particle beam is also kept electrically conductive. The negative voltage Vc is applied to the side (where the injection outlets 211 are formed) of the charge preventive member 210 which faces the specimen 21.

In the present embodiment, since the flow channels 212 near their injection outlets 211 of the charge preventive member 210 are inclined toward the electron beam irradiation spot on the specimen 21, nitrogen gas can reach the electron beam irradiation spot on the specimen. Each of the gas injection outlets may be provided with a nozzle whose angle of inclination can automatically be changed. In addition, although the charge preventive member 210 has four gas injection outlets formed as mentioned above, the injection outlets may be changed in population and formation. For example, gas injection slits may be formed around the opening of the CCP. In addition, the number of gas injection outlets may be increased to 6, 8 or more.

In the present embodiment, the gas emitted toward the specimen is ionized as a result of reacting with primary electrons of the electron beam or secondary electrons or reflected electrons caused by the electron beam. Created ions can react with electrons on the surface of the specimen. This removes negative charges from the specimen.

Further, in the present invention, since the charge preventive member is biased at a voltage which is almost equal to or smaller than the voltage (negative voltage) of the specimen so as to reduce the potential difference between the charge preventive member and the specimen, it is possible to avoid the charging and discharging of the specimen.

Figure 7:
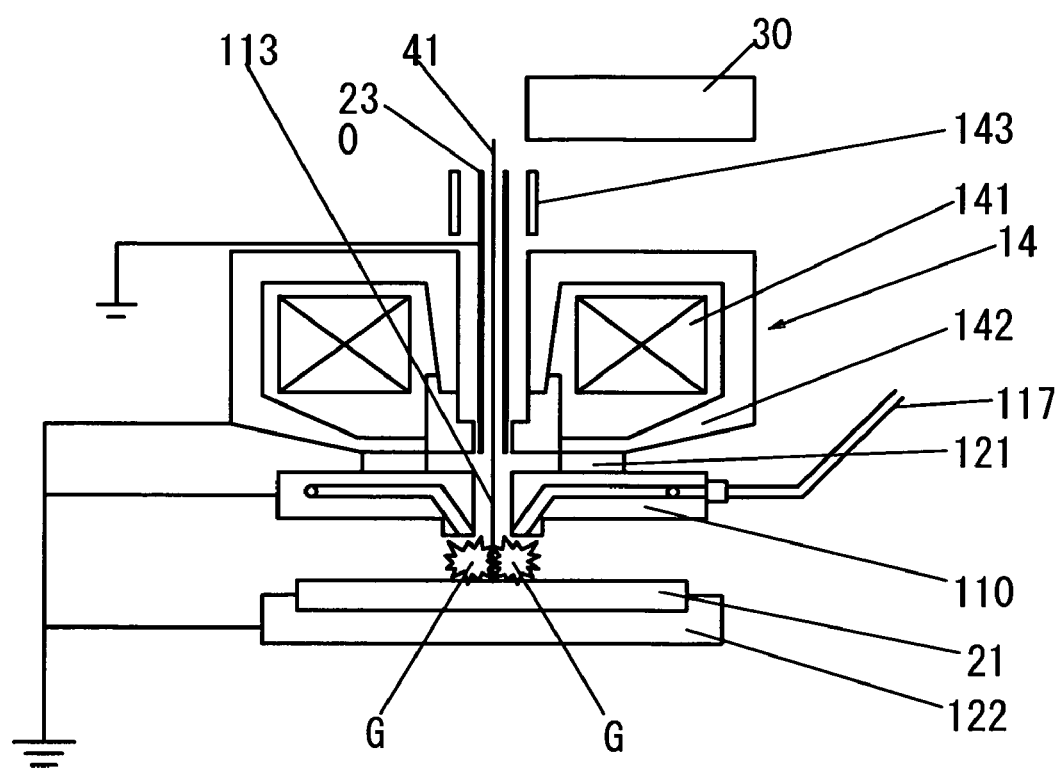
FIG. 7 is a sectional view showing another charged particle beam apparatus embodiment.

The following describes another embodiment of the present invention. This embodiment is similar in configuration to the embodiment shown in FIG. 2. In the present embodiment as shown in FIG. 7, the charged particle optical system has an inner cylinder 230 and −1 kV electron gun provided therein. The specimen 21, specimen holder 122 and charge preventive member 110 are earthed. To the inner cylinder 230, a positive voltage of +2 kV is applied. In the charged particle optical system, generated charged particles move according to the certain energy given therein. As the charged particles approaches to the specimen 21, its convergence factor decreases since they decelerate (due to a steep drop of the acceleration voltage from +2 kV to 0 kV). Before charged particles reaches the specimen surface, the charged particle acceleration voltage decreases sharply to 0 kv. Since this reduces the number of electrons and other charged particles accumulating on the specimen, it is possible to prevent charging of the specimen.

Figure 8:
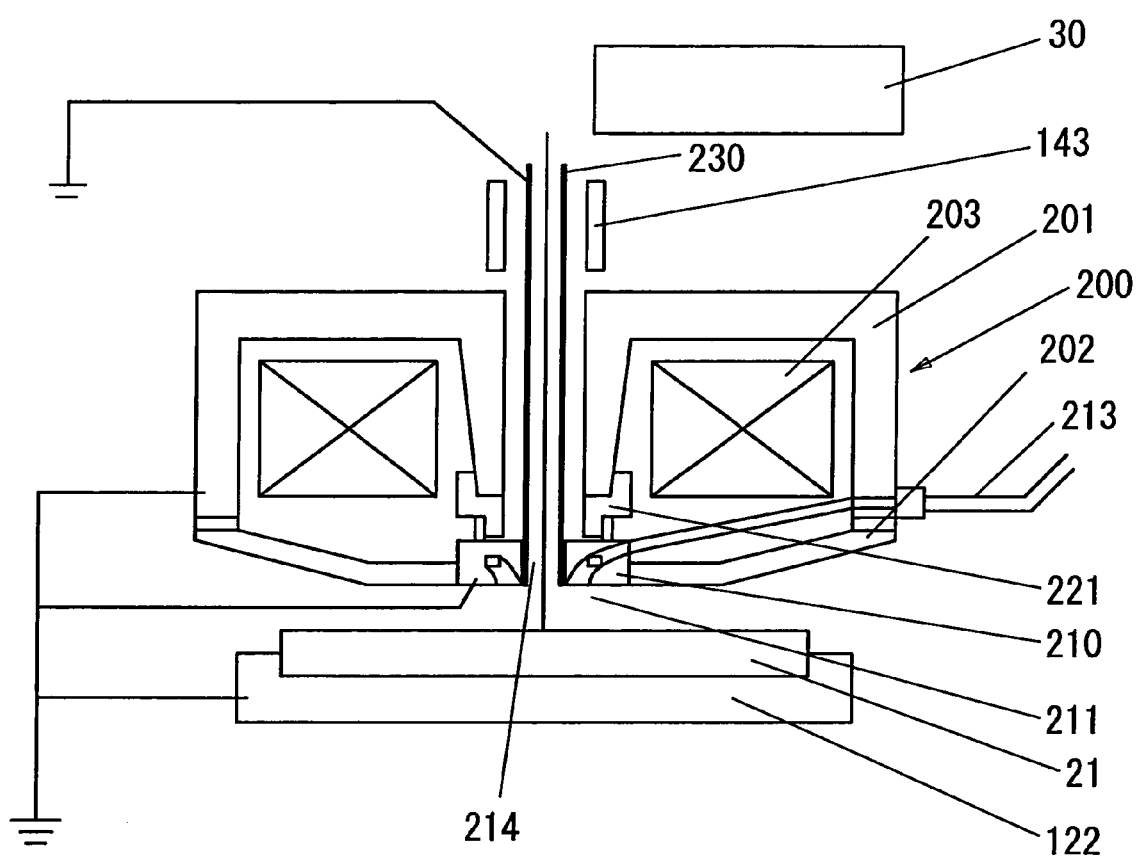
FIG. 8 is a sectional view showing another charged particle beam apparatus embodiment.
Figure 9:
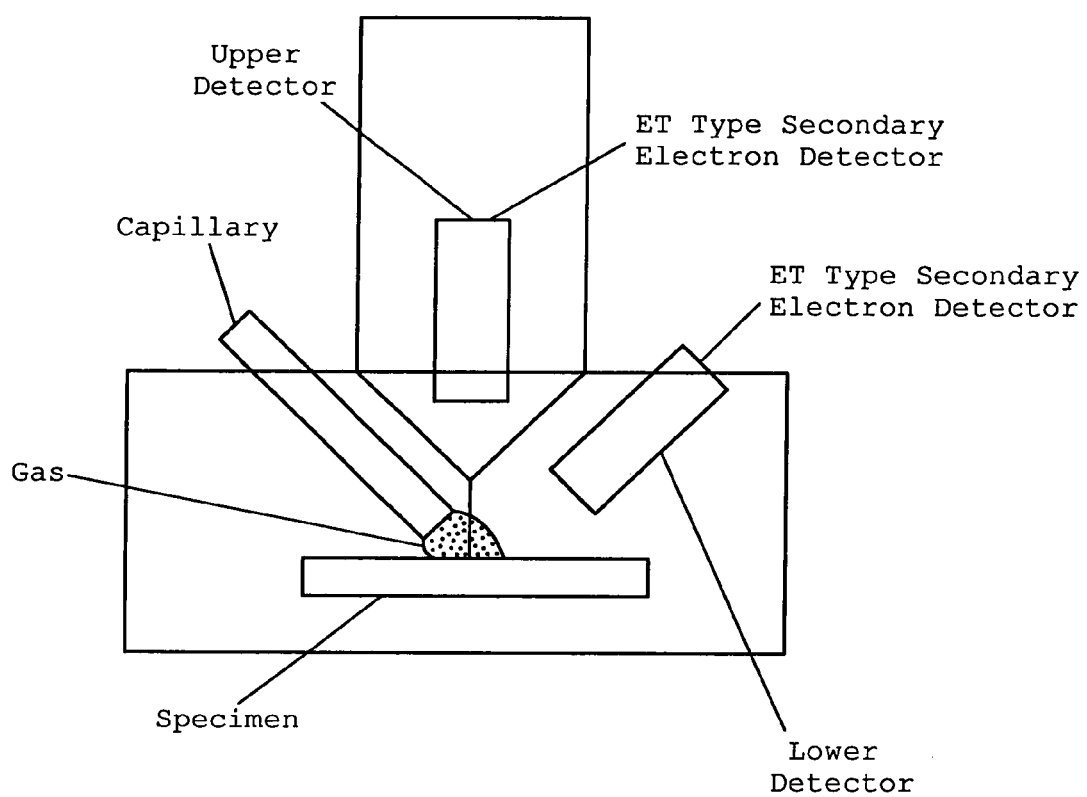
FIG. 9 is a side view showing a conventional charged particle beam apparatus.

FIG. 8 shows another embodiment provided with an inner cylinder 230. This embodiment is different from the charged particle beam apparatus shown in FIG. 7 in that an inner cylinder 230 is included and the specimen 21, specimen holder 122 and charge preventive member 210 are earthed. Similar to the above-mentioned embodiment, a positive voltage of +2 kV is applied to the inner cylinder 230. The present embodiment can reduce the number of electrons and other charged particles accumulating on the specimen and therefore prevent charging of the specimen.

What is claimed is:

1. A charged particle beam apparatus which illuminates a specimen with a charged particle beam focused thereon via a charged particle optical system arranged in a column, wherein:

between the charged particle optical system and the specimen, there is provided a plate-like member having an electrically conductive portion and an opening to transmit the charged particle beam; and for the plate-like member to function as a charge preventive plate, the plate-like member is configured in such a manner that the plate-like member is enough large to cover at least a part of the charged particle optical system when viewed from the charged particle beam irradiation spot on the specimen, the plate-like member has a gas inflow path formed therein, and the gas inflow path has gas injection outlets formed to inject gas toward the charged particle beam irradiation spot on the specimen.

2. The charged particle beam apparatus according to claim 1, wherein the conductance between the plate-like member and the specimen is made larger than the conductance between the plate-like member and the charged particle optical system.

3. The A charged particle beam apparatus according to claim 1, wherein the side of the plate-like member which faces the specimen has one or more gas injection outlets.

4. The charged particle beam apparatus according to claim 1, wherein voltages are respectively applied to the specimen or a holding member to hold the specimen and to the electrically conductive portion of the specimen.

5. The charged particle beam apparatus according to claim 1, wherein the voltage applied to the electrically conductive portion of the specimen is a negative voltage which is substantially equal to or smaller than the voltage applied to the specimen or the specimen holding member.

6. The charged particle beam apparatus according to claim 1, wherein the plate-like member is insulatively fixed to a lower magnetic pole of an objective lens disposed in the lower portion of the column.

7. The charged particle beam apparatus according to claim 1, wherein the opening of the plate-like member is several millimeters in diameter.

8. The charged particle beam apparatus according to claim 1, wherein the plate-like member is configured as a part of a lower magnetic pole of a objective lens disposed in the lower portion of the column.

9. The charged particle beam apparatus according to claim 1, wherein for the plate-like member to function as a charge preventive plate, the charged particle beam apparatus is configured in such a manner that the charged particle optical system has an inner cylinder to transmit the charged particle beam, a positive voltage is applied to the inner cylinder and the specimen and the plate-like member are earthed.

10. The charged particle beam apparatus according to claim 1, wherein the gas comprises at least one kind of gas selected from nitrogen, argon, oxygen and ozone.

11. A charged particle beam apparatus which illuminates a specimen with a charged particle beam focused thereon via a charged particle optical system, wherein:

a non-magnetic member is set to an objective lens of the charged particle optical system, the sides of the non-magnetic member which respectively faces the light path of the charged particle optical system and the specimen are electrically conductive, the non-magnetic member has a gas inflow path formed therein, and the gas inflow path has gas injection outlets formed on the side of the non-magnetic member facing the specimen to inject gas toward the charged particle beam irradiation spot on the specimen.

12. The charged particle beam apparatus according to claim 11, wherein the conductance between the bottom of the non-magnetic member and the specimen is larger than the conductance of the non-magnetic member along the light path of the charged particle optical system.

13. The charged particle beam apparatus according to claim 11 wherein:
   the non-magnetic member is constituted by a specimen-side component facing the specimen and a light path-side component facing the light path of the charged particle optical system wherein the specimen-side component and the light path-side component are electrically insulated from each other; and
   voltages are respectively applied to the specimen or a specimen holding member and to the specimen-side component of the non-magnetic member.

14. The charged particle beam apparatus according to claim 13, wherein the voltage applied to the specimen-side component of the non-magnetic member is a negative voltage which is substantially equal to or smaller than the voltage applied to the specimen or the specimen holding member.

15. The charged particle beam apparatus according to claim 11, wherein the gas comprises at least one kind of gas selected from nitrogen, argon, oxygen and ozone.

16. The charged particle beam apparatus according to claim 11, wherein for the non-magnetic member to function as a charge preventive member, the charged particle beam apparatus is configured in such a manner that the charged particle optical system has an inner cylinder to transmit the charged particle beam, a positive voltage is applied to the inner cylinder and the specimen and the non-magnetic member are earthed.

17. The charged particle beam apparatus according to claim 16, wherein the gas comprises at least one kind of gas selected from nitrogen, argon, oxygen and ozone.

* * * * *